United States Patent
Peng et al.

(10) Patent No.: US 7,411,906 B2
(45) Date of Patent: Aug. 12, 2008

(54) METHOD FOR OPTIMIZING FREQUENCY OF CLOCK SIGNAL AND NETWORK SWITCH USING SAME

(75) Inventors: Hsi-Chih Peng, Taipei (TW); Mike Duh, Taipei (TW)

(73) Assignee: Via Technologies, Inc., Taipei (TW)

( * ) Notice: Subject to any disclaimer, the term of this patent is extended or adjusted under 35 U.S.C. 154(b) by 929 days.

(21) Appl. No.: 10/799,488

(22) Filed: Mar. 12, 2004

(65) Prior Publication Data

US 2004/0218634 A1    Nov. 4, 2004

(30) Foreign Application Priority Data

Apr. 29, 2003    (TW) ............... 92110078 A

(51) Int. Cl.
    *H04L 12/26*    (2006.01)
(52) U.S. Cl. ...................... 370/231; 370/236
(58) Field of Classification Search ......... 370/229–235, 370/236, 395.2–395.21; 710/29; 375/215, 375/226; 709/102–105, 230–234
See application file for complete search history.

(56) References Cited

U.S. PATENT DOCUMENTS

| | | | |
|---|---|---|---|
| 6,256,320 B1 * | 7/2001 | Tang et al. ............ | 370/462 |
| 6,298,067 B1 * | 10/2001 | Tang ..................... | 370/462 |
| 6,317,804 B1 * | 11/2001 | Levy et al. ............. | 710/305 |
| 6,442,137 B1 * | 8/2002 | Yu et al. ................ | 370/232 |
| 2004/0090995 A1 * | 5/2004 | Kang et al. ............. | 370/535 |

FOREIGN PATENT DOCUMENTS

CN    1294327    5/2001

\* cited by examiner

*Primary Examiner*—Chi H. Pham
*Assistant Examiner*—Thai D Hoang
(74) *Attorney, Agent, or Firm*—Kirton & McConkie; Evan R. Witt

(57) ABSTRACT

A method for optimizing frequency of a clock signal is provided for operations of a network switch. The network switch includes a clock signal generator for generating the clock signal, and a plurality of input/output ports for communicating therevia with at least one network node. Firstly, a control signal is asserted to the clock signal generator according to a certain condition of the input/output ports, e.g. the count of the I/O ports in use or the overall data transmission rate of the I/O ports in use. Then, the frequency of the clock signal outputted from the clock signal generator is adjusted in response to the control signal.

7 Claims, 4 Drawing Sheets

METHOD FOR OPTIMIZING FREQUENCY OF CLOCK SIGNAL AND NETWORK SWITCH USING SAME

FIELD OF THE INVENTION

The present invention relates to a method for optimizing the frequency of a clock signal, and more particularly to a method for optimizing the frequency of a clock signal provided for the operation of a network switch. The present invention also relates to a network switch using this method.

BACKGROUND OF THE INVENTION

Network switches are widely used among a plurality of nodes to share open sources. For example, a network switch can be used to connect a plurality of computers or other devices such as network printers or network storages. Referring to FIG. 1, a conventional network switch 1 principally comprises a control chip 10, a clock source 11, and a plurality of input/output (I/O) ports. The control chip 10 is formed with a switch matrix 100 for controlling data flows among a plurality of media access controllers (MACs) B1~Bn, an embedded memory 102 and a phase-locked loop (PLL) clock signal generator 103. For each input/output (I/O) port, a physical device (PHY) A1~An is in communication with one of the media access controller B1~Bn. In response to a reference clock signal generated from the clock source 11, the PLL clock signal generator 103 generates a clock signal, which is referred by various units to coordinate operations in the control chip 10. Via the physical layers A1~An, the media access controllers B1~Bn communicate with the corresponding network nodes to conduct data transmission.

In practice, bandwidths of network interface cards used in the network nodes connected to the same network switch are likely to differ from one another. Currently, network interface cards of three kinds of bandwidth specifications, i.e. 10, 100 and 1000 Mb/s, are commonly used with the physical devices A1~An. Alternatively, it is possible for any of the physical devices A1~An to remain floating. Even if some of the I/O ports of the network switch 1 do not connect to any network node, the frequency of the clock signal provided by the PLL clock signal generator 103 in the prior art still has to conform to the maximal bandwidth requirement just in case that all the I/O ports may be occupied with the highest bandwidth.

For example, for a network switch having two I/O ports supporting three kinds of bandwidth specifications (10/100/1000 Mb/s) and the other twenty two I/O ports supporting two kinds of bandwidth specifications (10/100 Mb/s), the PLL clock signal generator 103 should be designed to generate a high frequency clock signal adapted to the situation that all the I/O ports are operated under their highest bandwidths. The required frequency of the clock signal is generally up to 100 M/s. For supplying such a high frequency clock signal, the control chip 10 always operates at a high speed so as to result in the high temperature and high power consumption of the network switch, or possibly, halt the network switch.

SUMMARY OF THE INVENTION

The present invention provides a method for optimizing the frequency of a clock signal provided for operations of a network switch so as to minimize power consumption of the network switch.

The present invention also provides a network switch, which allows the clock signal provided for operations of the network switch to be adjusted according to practical occupying situation of the I/O ports.

In accordance with a first aspect of the present invention, there is provided a method for optimizing frequency of a clock signal provided for operations of a network switch. The network switch comprises a clock signal generator for generating the clock signal, and a plurality of input/output ports for communicating therevia with at least one network node. Firstly, a control signal is asserted to the clock signal generator according to a certain condition of the input/output ports. Then, the frequency of the clock signal outputted from the clock signal generator is adjusted in response to the control signal.

In an embodiment, the certain condition of the input/output ports is a count of the input/output ports in use.

In an embodiment, the frequency of the clock signal is adjusted by the following criterions. In response to a first control signal corresponding to a first count of the input/output ports in use, a first clock signal with a first frequency is generated. In response to a second control signal corresponding to a second count of the input/output ports in use greater than the first count, a second clock signal with a second frequency higher than the first frequency is generated. In response to a third control signal corresponding to a third count of the input/output ports in use less than the first count, a third clock signal with a third frequency lower than the first frequency is generated.

In an embodiment, the method further comprises a step of subtracting a count of the input/output ports without connecting to any network node from a total count of the input/output ports included in the network switch to obtain the count of the input/output ports in use.

In an embodiment, the certain condition of the input/output ports is data transmission rates of the input/output ports in use.

In an embodiment, the certain condition of the input/output ports is an overall data transmission rate of all the input/output ports connecting to network nodes.

In an embodiment, the frequency of the clock signal is adjusted by the following criterions. In response to a first control signal corresponding to a first overall data transmission rate of the input/output ports, a first clock signal with a first frequency is generated. In response to a second control signal corresponding to a second overall data transmission rate of the input/output port higher than the first overall data transmission rate, a second clock signal with a second frequency higher than the first frequency is generated. In response to a third control signal corresponding to a third overall data transmission rate of the input/output port lower than the first overall data transmission rate, a third clock signal with a third frequency lower than the first frequency is generated.

In accordance with a second aspect of the present invention, there is provided a method for adjusting a frequency of a clock signal provided for operations of a network switch. The network switch comprises a clock signal generator for generating the clock signal, and a plurality of input/output ports for communicating with a plurality of network nodes. Firstly, connection states of the input/output ports with the plurality of network nodes are detected. Then, the frequency of the clock signal is adjusted according to the connection states of the input/output ports with the plurality of network nodes. Afterward, the detecting and adjusting steps are repeated at intervals of a predetermined period.

In an embodiment, the connection states of the input/output ports are detected by counting the input/output ports connecting to network nodes.

In an embodiment, the connection states of the input/output ports are detected by summing the overall data transmission rate of the input/output ports connecting to network nodes.

In accordance with a third aspect of the present invention, there is provided a network switch for conducting data transmission among network nodes. The network switch comprises a first number of input/output ports, a connection-state detector and a clock signal generator. The first number of input/output ports is used for connecting to a variable number of network nodes, wherein the variable number is equal to or less than the first number. The connection-state detector is in communication with the first number of input/output ports, detects connection states of the input/output ports with the variable number of network nodes, and asserts a control signal according to the connection states of the input/output ports. The clock signal generator generates a clock signal having a frequency determined according to the control signal.

In an embodiment, the connection states of the input/output ports are detected by counting the variable number of the network nodes.

In an embodiment, the connection states of the input/output ports are detected by summing the overall data transmission rate associated with the variable number of network nodes.

In an embodiment, the clock signal generator is a phase-locked loop clock signal generator.

In an embodiment, the clock signal generator and the connection state detector are integrated in a control chip.

The above concepts and advantages of the present invention will become more readily apparent to those ordinarily skilled in the art after reviewing the following detailed description and accompanying drawings, in which:

DETAILED DESCRIPTION OF THE PREFERRED EMBODIMENT

To compare with the prior art, the advantages of the invention is obvious. The invention could adjust the frequency of the clock signal of the clock signal generator according to both the number of currently used I/O ports and the current transmission rate of the currently used I/O ports. Therefore, the invention could adjust the frequency to the really required value, and need not to adjust the frequency to the upper limitation of all possibly required values. Clearly, when the really required value is less than the upper limitation, the invention could lower down the frequency and then further lower down both the temperature and the power consumption. The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
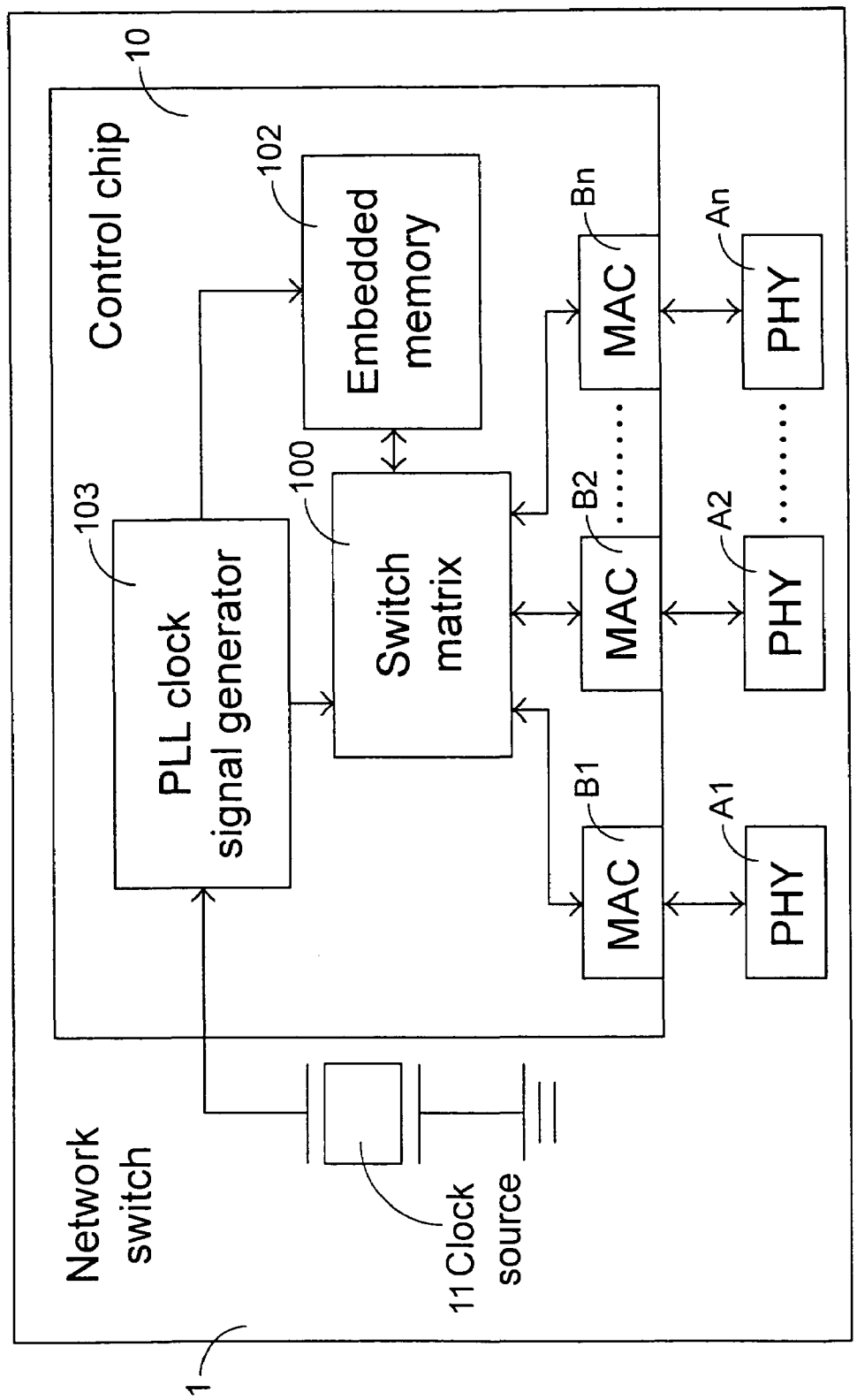
FIG. 1 is a functional block diagram of a conventional network switch.
Figure 2:
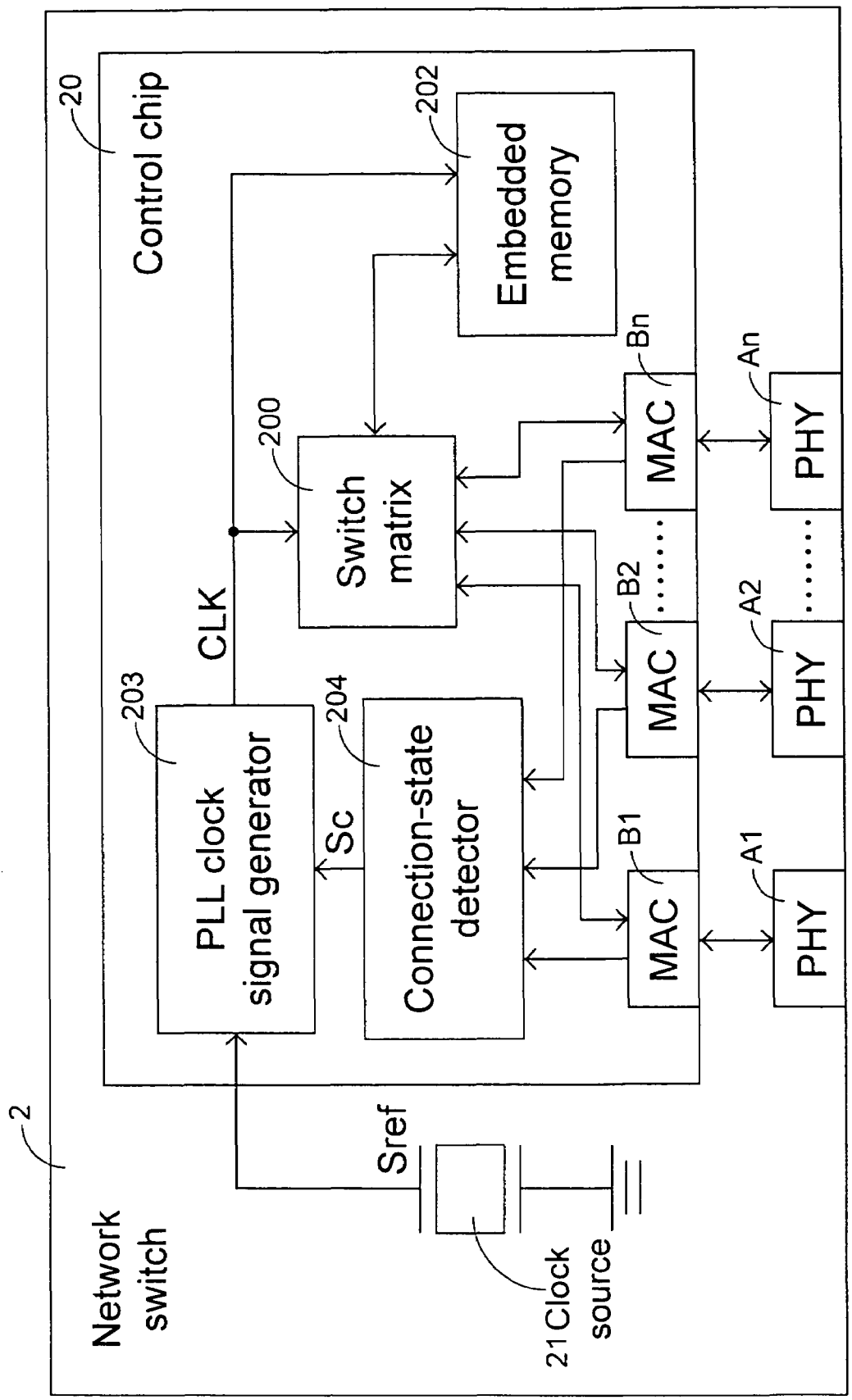
FIG. 2 is a functional block diagram of a network switch according to a preferred embodiment of the present invention.

Referring to FIG. 2, a functional block diagram of a network switch according to a preferred embodiment of the present invention is shown. The network switch comprises a control chip 20, a clock source 21, and a plurality of input/output (I/O) ports. The control chip 20 is formed with a plurality of media access controllers (MACs) B1~Bn, a switch matrix 200, an embedded memory 202, a phase-locked loop (PLL) clock signal generator 203 and a connection-state detector 204. For each input/output (I/O) port, a physical device (PHY) A1~An is in communication with one of the media access controller B1~Bn. Via the physical layers A1~An, the media access controllers B1~Bn communicate with the correspondingly interconnected network nodes to conduct data transmission. The switch matrix 200 controls data flows among the MACs B1~Bn. The PLL clock signal generator 203 provides a clock signal for various units in the control chip in response to a source clock signal Sref generated by the clock source 21 in order to coordinate the operations in the control chip. The connection-state detector 204 is in communication with the media access controllers B1~Bn for realizing the connection states of the input/output ports to the network nodes. The operation principles of the network switch will be described in more details as follows.

Figure 3:
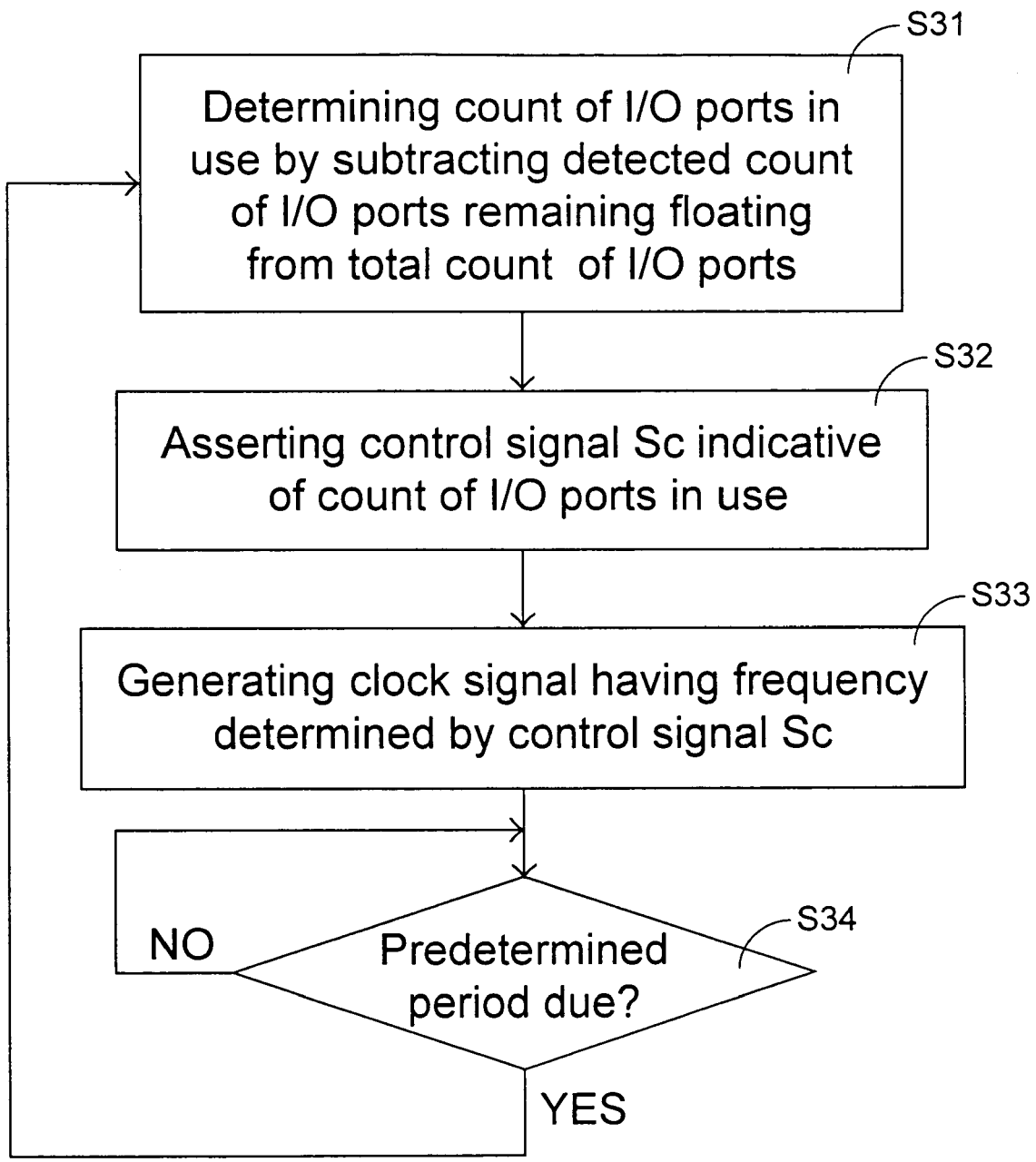
FIG. 3 is a flowchart illustrating a method for optimizing frequency of a clock signal according to the count of the input/output ports in use.

A method for optimizing frequency of a clock signal according to the present invention is illustrated with reference to the flowchart in FIG. 3. By means of the connection-state detector 204, a count of the input/output ports connecting to network nodes or remaining floating is determined. In the case that the count of the input/output ports connecting thereto no network nodes is determined by the connection-state detector 204, a subtraction operation of subtracting that count from a total count of the input/output ports included in the network switch is firstly performed to obtain the count of the input/output ports in use (Step S31). Taking a commonly used 24-port network switch for example, two 10/100/1000 Mb/s I/O ports (three kinds of data transmission rates) and twenty-two 10/100 Mb/s I/O ports (two kinds of data transmission rates) are included. In practice, the 1000 Mb/s network interface card has not been popular so far, so the two high-rate I/O ports are usually floating. The other twenty-two low-rate I/O ports are not occupied all the time. The connection-state detector 204 is thus used to detect the connection state of the I/O ports and the network nodes, and determine how many I/O ports are in use. Accordingly, a control signal Sc indicative of the count of the I/O ports in use is asserted from the connection-state detector 204 (Step S32). In response to the control signal Sc and the source clock signal Sref generated from the clock source 21, the PLL clock signal generator 203 generates a clock signal CLK operated at a certain frequency f (Step S33). The connection-state detector 204 will periodically determine the connection states of the I/O ports in use (Step S34). If an increasing number of input/output ports U2 in use is determined, the clock signal generated from the PLL clock signal generator 203 will have a frequency higher than f. On the other hand, if a decreasing number of input/output ports in use is determined, the clock signal generated from the PLL clock signal generator 203 will have a frequency lower than f.

Since the clock signal CLK generated from the PLL clock signal generator 203 has a frequency dynamically adjusted according to the count of input/output ports currently in use, the control chip 20 can be operated at an optimal speed rather than a redundantly high speed as in the prior art. Therefore, the high temperature and high power consumption problems of the network switch can be overcome. Notice that it is better to smoothly performed the adjustment of the frequency of the clock signal in order to avoid possible errors resulting from the dramatically changed clock signal.

In the above embodiment, a procedure for adjusting the frequency of the clock signal according to the count of the input/output ports currently in use is illustrated. Alternatively, the frequency of the clock signal can also be adjusted according to an overall data transmission rate of the input/output ports in use.

Figure 4:
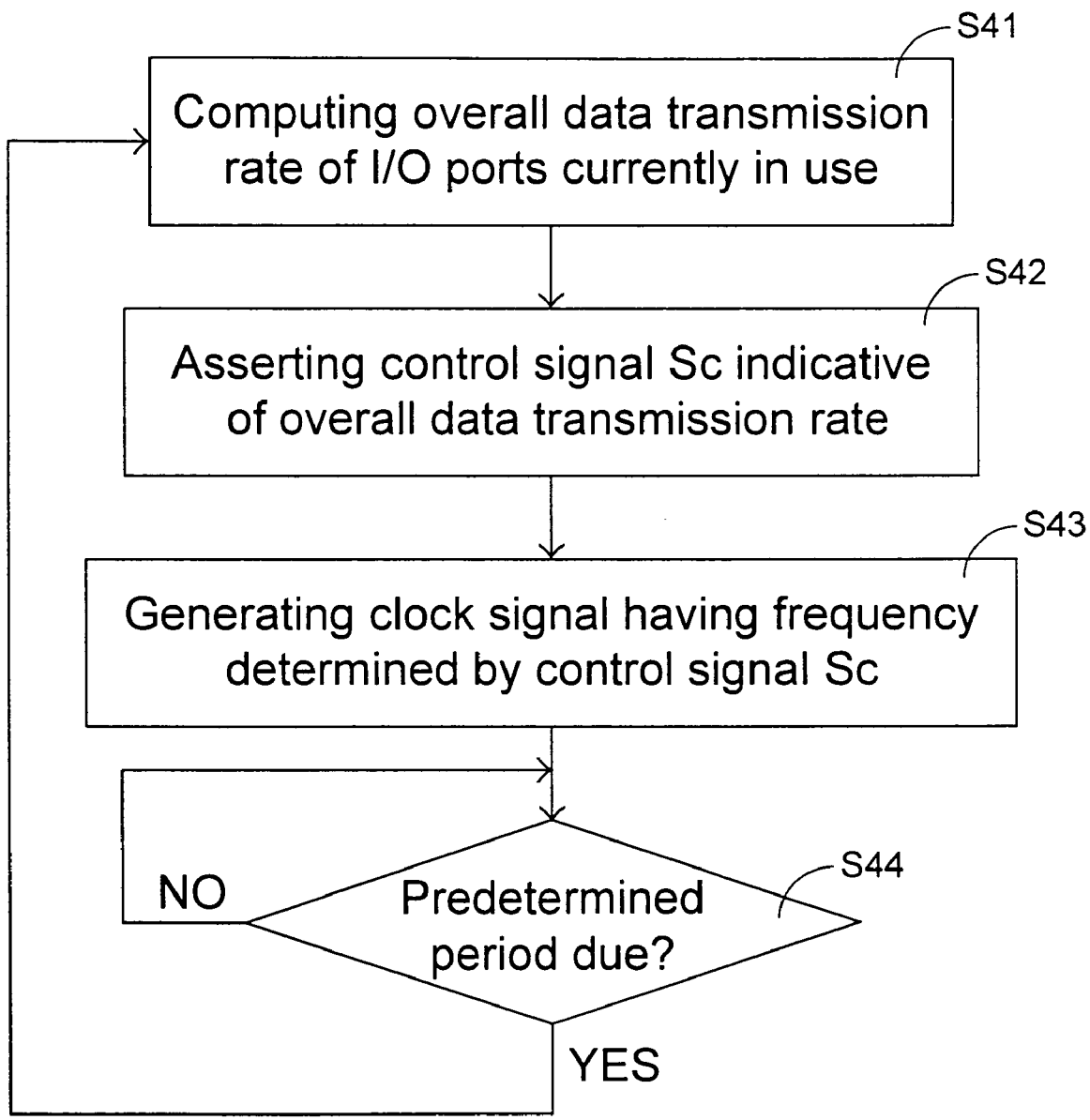
FIG. 4 a flowchart illustrating another method for optimizing frequency of a clock signal according to the overall data transmission rate of the input/output ports in use.

Take the commonly used 24-port network switch including two 10/100/1000 Mb/s I/O ports (three kinds of data transmission rates) and twenty-two 10/100 Mb/s I/O ports (two kinds of data transmission rates) for example again. Please refer to the flowchart of FIG. 4. Firstly, an overall data transmission rate of all the input/output ports connecting to network nodes, i.e. in use, is computed (Step S41). For example, the network switch has now k1, k2, and k3 I/O ports supporting bandwidths specifications of 10, 100 and 1000 Mb/s, respectively, and the other I/O ports are left disconnecting to any network node. In this case, the overall data transmission rate $R1=10 \times k1+100 \times k2+1000 \times k3+0 \times (24-k1-k2-k3)$. Accordingly, a control signal Sc indicative of the overall data transmission rate R1 is asserted by the connection-state detector 204 (Step S42). Then, in response to the control signal Sc, the PLL clock signal generator 203 generates a clock signal CLK having a frequency f complying with the requirement of the data transmission rate R1 (Step 43). The connection-state detector 204 will periodically detect the overall data transmission rate of all the input/output ports connecting to network nodes. If the overall data transmission rate increases, the frequency of the clock signal generated from the PLL clock signal generator 203 is adjusted to be higher than the frequency f. On the other hand, if the overall data transmission rate decreases, the clock signal generated from the PLL clock signal generator 203 will be adjusted to have a frequency lower than the frequency f.

Likewise, since the clock signal generated from the PLL clock signal generator 203 is dynamically adjusted according to the overall data transmission rate, the control chip 20 can be operated at an optimal speed rather than a high speed required only in the situation that all the I/O ports be operated under their highest bandwidths. Therefore, power consumption of the network switch is minimized, and the performance of the network switch is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for optimizing frequency of a clock signal provided for operations of a network switch, said network switch comprising a clock signal generator for generating said clock signal, and a plurality of input/output ports for communicating therevia with at least one network node, said method comprising steps of:

asserting a control signal to said clock signal generator according to a count of said input/output ports in use; and adjusting the frequency of said clock signal outputted from said clock signal generator in response to said control signal.

2. The method according to claim 1 wherein the step for adjusting the frequency of said clock signal comprises:

generating a first clock signal with a first frequency in response to a first control signal corresponding to a first count of said input/output ports in use;

generating a second clock signal with a second frequency higher than said first frequency in response to a second control signal corresponding to a second count of said input/output ports in use greater than said first count; and generating a third clock signal with a third frequency lower than said first frequency in response to a third control signal corresponding to a third count of said input/output ports in use less than said first count.

3. The method according to claim 1 further comprising a step of subtracting a count of said input/output ports without connecting to any network node from a total count of said input/output ports included in said network switch to obtain said count of said input/output ports in use.

4. A method for adjusting a frequency of a clock signal provided for operations of a network switch, said network switch comprising a clock signal generator for generating said clock signal, and a plurality of input/output ports for communicating with a plurality of network nodes, said method comprising steps of:

detecting connection states of said input/output ports by counting said input/output ports currently connecting to said of network nodes;

adjusting the frequency of said clock signal according to said connection states of said input/output ports with said plurality of network nodes; and repeating said detecting and adjusting steps at intervals of a predetermined period.

5. A network switch for conducting data transmission among network nodes, comprising:

a first number of input/output ports for connecting to a variable number of network nodes, said variable number being equal to or less than said first number;

a connection-state detector in communication with said first number of input/output ports, detecting connection states of said input/output ports by counting said variable number of network nodes, and asserting a control signal according to said connection states of said input/output ports; and a clock signal generator generating a clock signal having a frequency determined according to said control signal.

6. The network switch according to claim 5 wherein said clock signal generator is a phase-locked loop clock signal generator.

7. The network switch according to claim 5 wherein said clock signal generator and said connection state detector are integrated in a control chip.

* * * * *